(12) United States Patent
Savignac et al.

(10) Patent No.: US 6,294,841 B1
(45) Date of Patent: Sep. 25, 2001

(54) INTEGRATED SEMICONDUCTOR CIRCUIT HAVING DUMMY STRUCTURES

(75) Inventors: Dominique Savignac, Ismaning; Robert Feurle, Neubiberg; Helmut Schneider, München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/327,699

(22) Filed: Jun. 8, 1999

(30) Foreign Application Priority Data

Jun. 8, 1998 (DE) .............................. 198 25 607

(51) Int. Cl.⁷ .................... H01L 23/48; H01L 23/52; H01L 29/40
(52) U.S. Cl. ................. 257/786; 257/622; 257/623; 438/926
(58) Field of Search .................. 257/786, 622, 257/623, 758; 438/926, 183

(56) References Cited

U.S. PATENT DOCUMENTS

| | | | |
|---|---|---|---|
| 5,032,890 | 7/1991 | Ushiku et al. | 257/211 |
| 5,278,105 | 1/1994 | Eden | 438/129 |
| 6,049,135 | * 4/2000 | Koike | 257/780 |

FOREIGN PATENT DOCUMENTS

| | | |
|---|---|---|
| 0409256A2 | 1/1991 | (EP) . |
| 2-140934-A | * 5/1990 | (JP) . |

* cited by examiner

Primary Examiner—Olik Chaudhuri
Assistant Examiner—Phat X. Cao
(74) Attorney, Agent, or Firm—Herbert L. Lerner; Laurence A. Greenberg; Werner H. Stemer

(57) ABSTRACT

An integrated semiconductor circuit includes dummy structures. A portion of capacitive elements present in the dummy structures is used in order to adapt input/output parameters of pads of the integrated semiconductor circuit to an external line. Metal options, fuses or switches are suitable for the connection. The structure is neutral with respect to surface area.

11 Claims, 3 Drawing Sheets

INTEGRATED SEMICONDUCTOR CIRCUIT HAVING DUMMY STRUCTURES

BACKGROUND OF THE INVENTION

Field of the Invention

The invention relates to an integrated semiconductor circuit.

As is known, integrated semiconductor circuits have what are referred to as pads, which are contact-connected to terminal pins of a housing and through which input or output signals to be processed by the semiconductor circuit are fed in or out or to which a supply potential is applied. The pads for signal input and output, in particular, are subjected to the requirement that adaptation to the connected line be performed.

By way of example, semiconductor circuits having the same circuit layout are to be connected to different bus systems. In that case, through the use of suitable circuit measures, the input/output parameters of the connections can be adapted to the desired value by suitable capacitance and resistance circuitry. If, on one hand, corresponding components outside the integrated semiconductor circuit are used for that purpose, that leads to a higher outlay for the circuit board construction and to corresponding disadvantages, e.g. an increased risk of failure. If, on the other hand, such components are realized in an integrated manner using conventional measures on the semiconductor chip, the area requirement of the circuit is increased, particularly by the realization of capacitances. A large number of process steps extending down into deeper layers of the integrated circuit are necessary in order to fabricate the integrated capacitor. Therefore, the integrated realization furthermore necessitates additional development outlay and a multiplicity of exposure masks separately assigned to each adaptation variant.

European Patent Application 0 409 256 A2 describes an integrated semiconductor circuit in which dummy structures are used to stabilize an internal supply voltage or to set a delay time for an internal signal. To that end, metal lines of the dummy structure which are not required for other purposes are connected to a supply potential line or to a signal output of a circuit block. The length of the signal line is trimmed through the use of a laser beam in order to provide the desired capacitance.

SUMMARY OF THE INVENTION

It is accordingly an object of the invention to provide an integrated semiconductor circuit having dummy structures, which overcomes the hereinafore-mentioned disadvantages of the heretofore-known devices of this general type and in which an adaptation to input/output parameters of its connections can be carried out with a lower outlay.

With the foregoing and other objects in view there is provided, in accordance with the invention, an integrated semiconductor circuit, comprising at least one pad for inputting or outputting a signal to be processed or for feeding in a supply potential; and a dummy structure having a multiplicity of repeatedly disposed capacitive elements, at least a portion of the capacitive elements coupled to the pad; each of the capacitive elements including a comparatively recessed section of a semiconductor substrate, a comparatively elevated section of the semiconductor substrate, and a polysilicon section insulated from the recessed and elevated sections.

Dummy structures which are present anyway in the integrated circuit are used in the invention. Such dummy structures are described, for example, in U.S. Pat. Nos. 5,032,890 and 5,278,105. They are formed of regular structures which are disposed on free, unused areas of the semiconductor chip, in order to ensure a uniform process behavior of the entire circuit during fabrication, e.g. during etching, while structures are being grown, or during chemical mechanical polishing, and to obtain a uniformly level, planar surface.

Those dummy structures have had no function in electrical terms heretofore. In the invention, a portion of those dummy structures is connected to the pad in accordance with the desired input/output signal behavior and their capacitive effect is utilized. An additional area requirement does not arise. The additional process complexity lies in providing corresponding wiring, which runs in the uppermost layers of the semiconductor circuit. Therefore, only the uppermost exposure masks have to be adapted and the structures situated underneath remain unchanged.

As an alternative, fuses may also be used instead of metal wiring. Portions of the dummy structures which are combined, if appropriate, to form larger regions, are connected to the pads by the fuses. Following the mask process steps during fabrication, fuses are melted through or blown in order to trim the capacitive loading on the pad to the desired value. A multiplicity of different settings of the input/output parameters are thereby obtained in a flexible and rapid manner.

Therefore, in accordance with another feature of the invention, there are provided interruptible fuses each connecting a respective one of the capacitive elements to the pad, the fuses connecting the portion of the multiplicity of the capacitive elements to the pad not being interrupted, and remaining fuses being interrupted.

As an alternative or in combination with the above embodiments, portions of the dummy structures are coupled to the output terminal through switches, having a switching state which is set during operation of the semiconductor memory.

Therefore, in accordance with a further feature of the invention, there are provided switching elements each connecting a respective one of the capacitive elements to the pad, the switching elements connecting the portion of the multiplicity of the capacitive elements to the pad being turned on during operation of the semiconductor circuit, and remaining switching elements being turned off during the operation of the semiconductor circuit.

In accordance with an added feature of the invention, there is provided a surface area not occupied by transistors, the dummy structure disposed in the surface area, an oxide layer disposed between the substrate and the polysilicon sections, the polysilicon sections disposed above at least the recessed sections of the semiconductor substrate, and a portion of the polysilicon sections connected to the pad.

In accordance with an additional feature of the invention, the polysilicon sections have a rectangular structure and are disposed at predetermined locations in a regular grid.

In accordance with yet another feature of the invention, a neighboring plurality of the polysilicon sections are jointly connected to one another to form a region, an interruptible fuse connects the common connection of the region to a common connection of a further corresponding region, and the interruptible fuse is interrupted unless the region is connected to the pad.

In accordance with yet a further feature of the invention, each of the regions includes a number of the interconnected polysilicon sections, and different regions are spaced apart defining a grid location at which no polysilicon section is disposed lying between directly neighboring polysilicon sections in the regions.

In accordance with yet an added feature of the invention, there is provided an interconnect connecting the portion of the multiplicity of the capacitive elements to the pad, the interconnect having a section through which a predetermined resistance is set, and the fuses or the switching elements disposed between the section and the connection to the polysilicon sections.

In accordance with a concomitant feature of the invention, there is provided a plurality of sections of interconnects electrically connected in parallel and through which the same predetermined resistance is set in each case.

Other features which are considered as characteristic for the invention are set forth in the appended claims.

Although the invention is illustrated and described herein as embodied in an integrated semiconductor circuit having dummy structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1B:
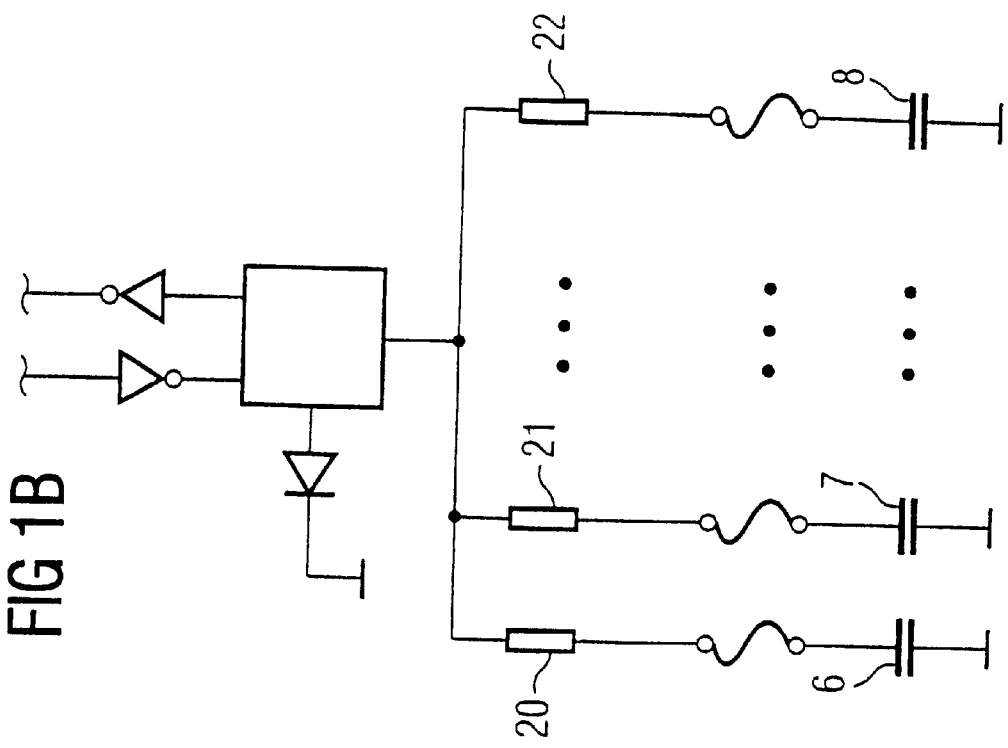
FIGS. 1A and 1B are basic schematic circuit diagrams of the invention.
Figure 1A:
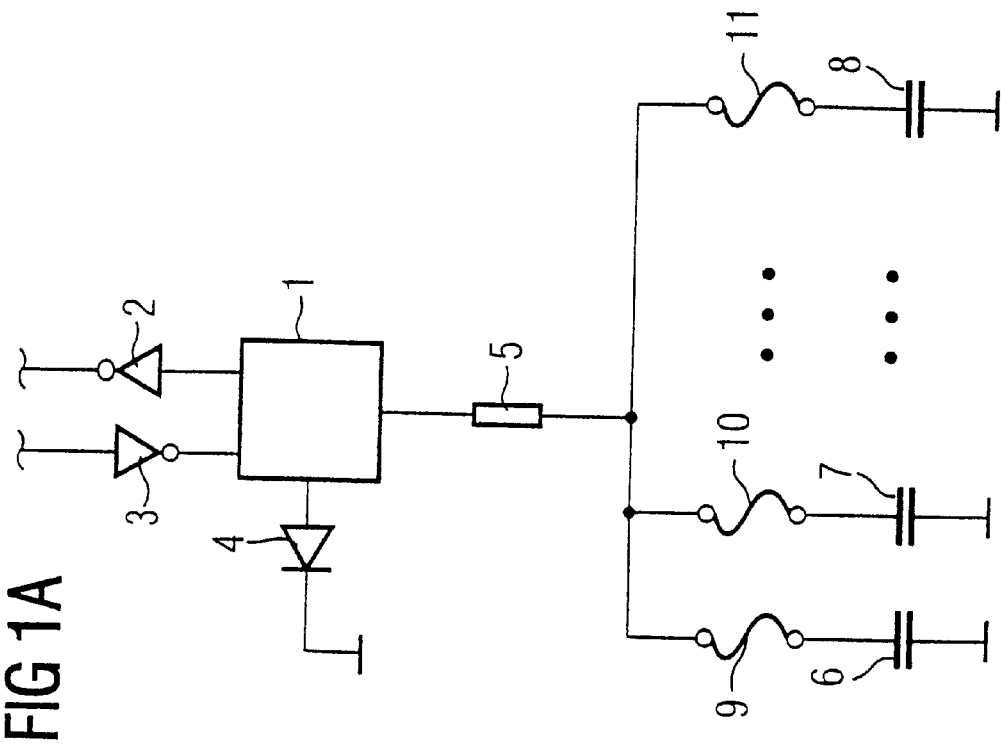

Referring now to the figures of the drawings in detail and first, particularly, to FIG. 1A thereof, there is seen a pad 1. The pad or contact surface 1 is a large-area region of a metallization layer at which an input signal is fed to an integrated circuit or an output signal is picked off from the integrated circuit. In addition, a supply potential can be fed in. The pad or terminal surface 1 is connected to terminal pins passing through a housing of the integrated circuit, usually through a bonding wire. In the illustrated exemplary embodiment, the pad 1 serves for inputting or outputting a signal to be processed by the integrated circuit. Such a signal is received through an input amplifier 2 or is output through an output amplifier 3. Furthermore, the pad 1 is protected against electrostatic discharge by a protection structure 4.

A configuration 5, 6, 7, 8, 9, 10, 11 serves for accurately setting an input/output signal behavior of the signals input or output at the pad 1. The configuration 5–11 is an RC element with an adjustable time constant. A resistor 5 is connected to ground through a multiplicity of capacitors that can be connected in parallel, of which capacitors 6, 7 and 8 are illustrated. The capacitors are connected to the resistor 5 through respective fuses 9, 10 and 11. The fuses are conductive for all of the capacitors after fabrication. A capacitive loading on the pad 1 is then at a maximum. After mask steps in the fabrication, a number of fuses are interrupted, with the result that capacitors are disconnected. The capacitive loading on the pad 1 is thereby set to a desired value. A laser beam is suitable for severing the fuse. The laser beam melts and destroys the respective fuse. As an alternative, it is possible to provide appropriate measures for interrupting a fuse through the use of current pulses. Trimming is controlled from an automatic test machine.

FIG. 1B shows a corresponding circuit, with the difference that resistors 20, 21, 22 are connected into current paths containing the capacitors. As a result, RC components 20, 6; 21, 7; 22, 8 are connected in parallel. Whereas the resistance is constant with regard to the capacitance circuitry in FIG. 1A, the time constant RC is constant in FIG. 1B. In that case, only the capacitive loading on the pad is adapted by severing corresponding fuses.

In the embodiment shown in FIGS. 1A and 1B, the same semiconductor circuit is used for different input/output parameters of the pad. The masks are not affected. With the electrical adaptation of the connections, it is therefore possible to react to changing customer requirements flexibly and at short notice.

Figure 4:
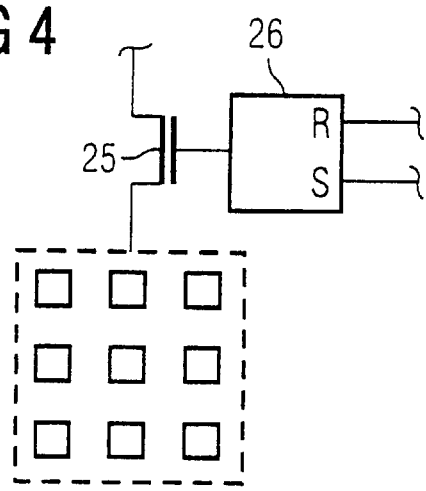
FIG. 4 is a schematic circuit diagram showing an exemplary embodiment for connecting the dummy structure to a pad during operation.

As an alternative to the provision of fuses, it is possible to set the input/output parameters of a pad through the use of a non-illustrated mask option. This means that only a portion of the capacitive elements which are provided in any case is connected to the pad during fabrication through the use of interconnects, preferably metal interconnects. The outlay for severing fuses in the automatic test machine is obviated. In contrast, it is necessary to adapt the mask of the metal wiring plane containing the interconnects. Moreover, as an alternative, the connection of the capacitive elements to the output pad is effected through a switch, by a switching transistor 25 in the exemplary embodiment illustrated in FIG. 4. The switching state of the switching transistor 25 is set by an RS flip-flop 26. The switch or switching transistor 25 is turned on for those capacitive elements which are to be connected to the pad. The switch 25 is turned off for the capacitive elements that are not to be connected. The flip-flop 26 is set during operation of the circuit. This realization affords the advantage that the adaptation of the input/output parameters of the pad is adjustable in a flexible manner during operation of the circuit.

Figure 2A:
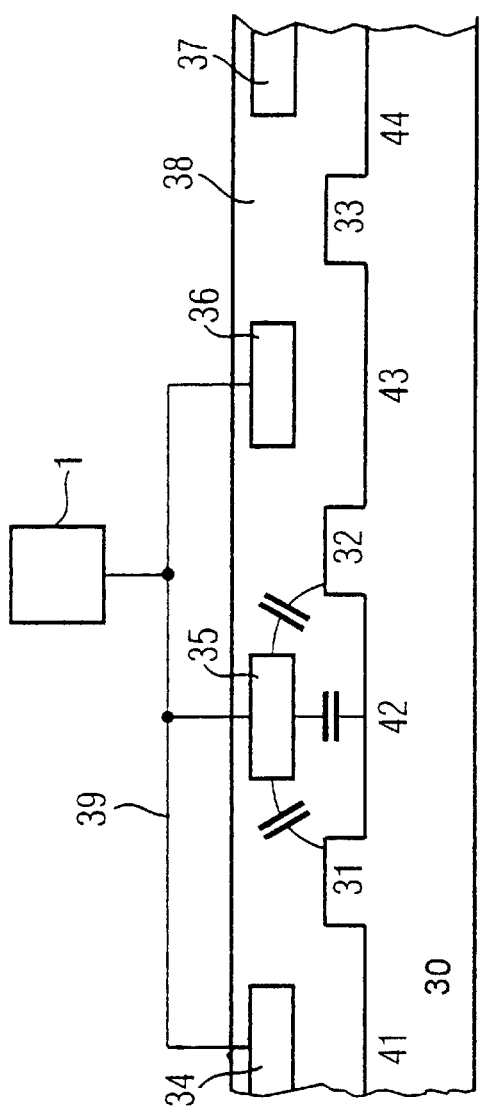
FIGS. 2A and 2B are respective cross-sectional and plan views of a dummy structure.
Figure 2B:
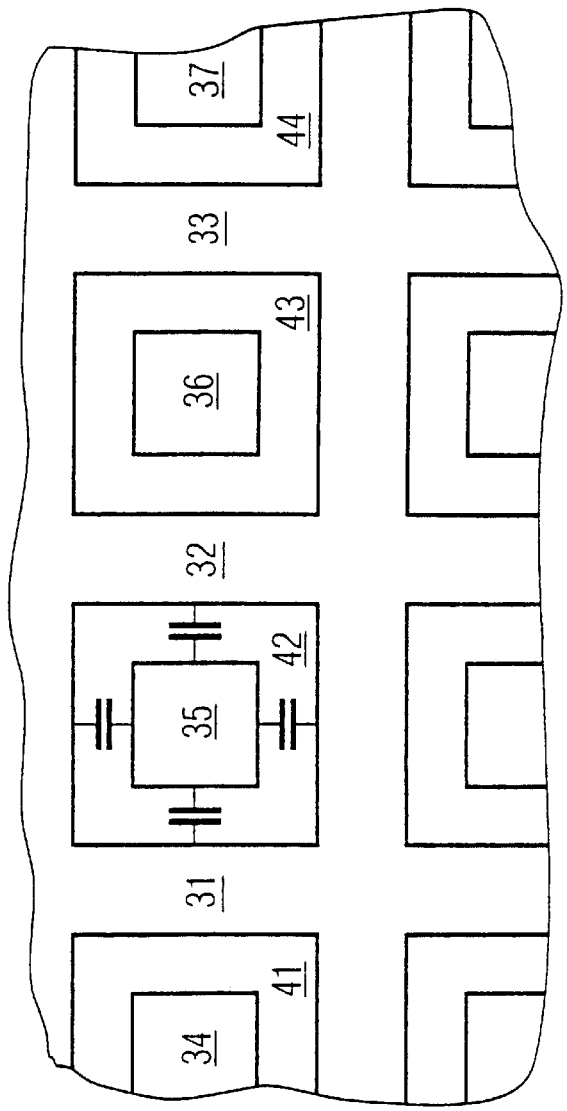

Dummy structures are known per se. They are disposed outside active regions, which include doping regions for the formation of components (e.g. diodes, transistors, resistors, capacitors), in order to effect a uniform process behavior and to planarize the surface of the chip. FIG. 2A shows a cross section through a dummy structure, and FIG. 2B shows a plan view therethrough. The dummy structure includes a semiconductor substrate 30 at the very bottom. Through the use of selective etching, the semiconductor substrate 30 acquires a surface structure made of recessed, lowered sections 41, 42, 43, 44 and, with respect thereto, elevated, projecting sections 31, 32, 33. An area section 34, 35, 36, 37 composed of polysilicon is disposed above each respective recessed section 41, 42, 43, 44. An area ratio between the polysilicon area and the total area expediently follows an area ratio between active areas, i.e. doping regions, and the total area in the region of the semiconductor circuit which is occupied by circuit sections. A capacitive element is formed between a polysilicon area and the neighboring recessed and raised sections of the substrate. Effective partial capacitances are illustrated by using the polysilicon area 35 in FIG.

2A as an example. The polysilicon areas may be situated completely within the recessed sections of the substrate or else they may cover the projecting sections. The capacitance which is formed is changed accordingly. An oxide layer 38 is situated between the regions and the substrate. The polysilicon sections 34, 35, 36, 37 have a rectangular form as seen in the plan view. They are centered with respect to the recessed sections 42. With regard to the vertical and horizontal directions, the polysilicon area and the substrate structure are constructed symmetrically in the illustrated exemplary embodiment. The capacitive element is disposed repeatedly in a regular grid. In the embodiment shown, the grid spacing and, consequently, the center point of the respective capacitive elements are identical in the vertical and horizontal directions.

The construction of the capacitive elements of the dummy structure is modular. In accordance with the desired capacitance assigned to the pad 1, portions of the capacitance elements 34, 35, 36, 37 are connected to the pad 1 through a symbolically illustrated connecting line or interconnect 39. The latter runs as a metal interconnect within a wiring plane above the polysilicon sections. As explained above, in addition, severable fuses or switching elements are provided in order to set the desired capacitance after fabrication or, if appropriate, during operation of the semiconductor circuit.

The line 39 has a section in which the resistances of the resistors 5 or 20, 21, 22 are realized. The resistance section forms the desired resistance in a manner which is known per se. By way of example, a metal alloy with a suitable resistance is used and/or the metal has a suitable profile and suitable cross section for setting the desired resistance. The spatial assignment of the resistance sections in relation to the pad 1 and to the fuses or switching elements is produced in accordance with FIG. 1.

As an alternative to the dummy structure which is constructed symmetrically in the horizontal and vertical directions and shown in FIG. 2, it is also possible to use a strip-shaped dummy structure, which is likewise constructed modularly but has properties of symmetry only with regard to one direction. In accordance with the desired capacitance assigned to the pad, a suitable number of polysilicon strips as well as strips of suitable length are to be jointly connected to the pad.

Figure 3:
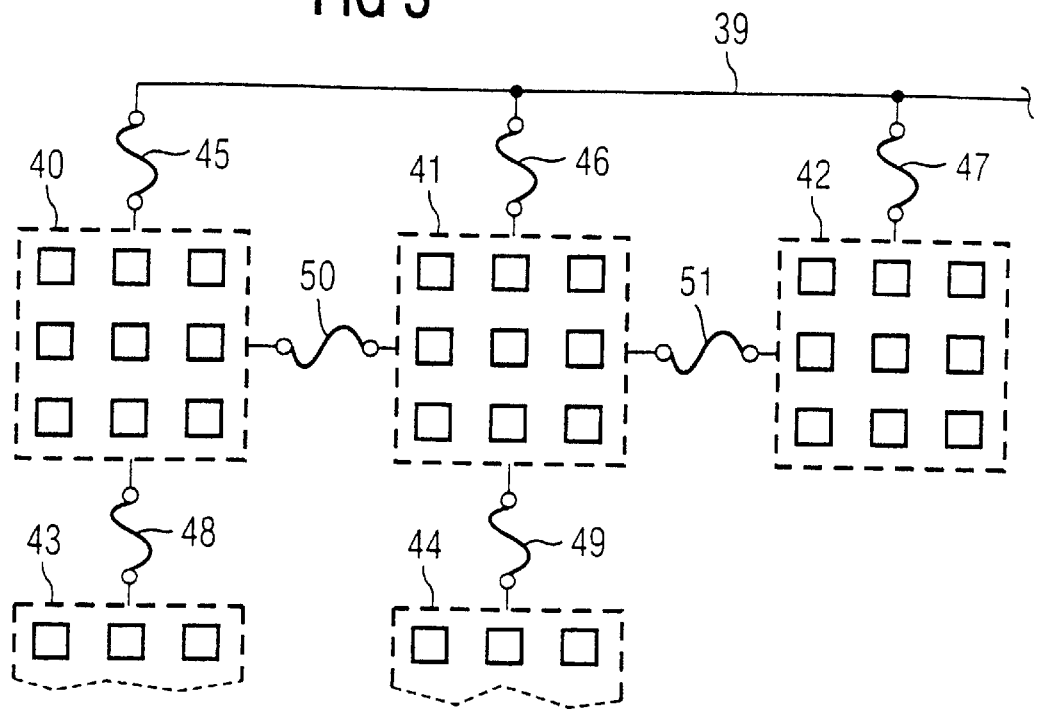
FIG. 3 is a schematic and diagrammatic view of various capacitance elements of the dummy structure which are combined to form larger regions and are connected to one another by fuses.

The contours of the capacitive elements are illustrated in a simplified manner in FIG. 3. A number of three times three capacitive elements form a region 40, which is bordered by a dashed line. The polysilicon sections within the region 40 are connected to one another through metal interconnects. The individual regions 40, 41, 42, 43, 44 are connected to lo one another through corresponding fuses 45, 46, 47, 48, 49, 50, 51. The fuses 45, 46, 47 lead together to the line 39 connected to the pad. Regions can be connected in series or in parallel with one another by severing different fuses. The capacitance associated with the pad can thereby be set relatively accurately. The capacitive elements are disposed altogether in the predetermined grid. Two regions, e.g. 40, 41 or 40, 43, are spaced apart in such a way that a capacitive element is absent at a grid location between the regions, since no polysilicon area is present there. The regions 40, 41, etc. act, for their part, as individual capacitors.

We claim:

1. An integrated semiconductor circuit, comprising:
   at least one pad for inputting or outputting a signal to be processed or for feeding in a supply potential; and
   a dummy structure having a multiplicity of repeatedly disposed capacitive elements, at least a portion of said capacitive elements coupled to said pad;
   each of said capacitive elements including a recessed section of a semiconductor substrate, an elevated section of said semiconductor substrate, and a polysilicon section insulated from said recessed and elevated sections.

2. The integrated semiconductor circuit according to claim 1, including interruptible fuses each connecting a respective one of said capacitive elements to said pad, said fuses connecting said portion of said multiplicity of said capacitive elements to said pad not being interrupted, and remaining fuses being interrupted.

3. The integrated semiconductor circuit according to claim 1, including switching elements each connecting a respective one of said capacitive elements to said pad, said switching elements connecting said portion of said multiplicity of said capacitive elements to said pad being turned on during operation of the semiconductor circuit, and remaining switching elements being turned off during the operation of the semiconductor circuit.

4. The integrated semiconductor circuit according to claim 1, including a surface area not occupied by transistors, said dummy structure disposed in said surface area, an oxide layer disposed between said substrate and said polysilicon sections, said polysilicon sections disposed above at least said recessed sections of said semiconductor substrate, and a portion of said polysilicon sections connected to said pad.

5. The integrated semiconductor circuit according to claim 4, wherein said polysilicon sections have a rectangular structure and are disposed at predetermined locations in a regular grid.

6. The integrated semiconductor circuit according to claim 5, wherein a neighboring plurality of said polysilicon sections are jointly connected to one another to form a region, an interruptible fuse connects said common connection of said region to a common connection of a further corresponding region, and said interruptible fuse is interrupted unless said region is connected to said pad.

7. The integrated semiconductor circuit according to claim 6, wherein each of said regions includes a number of said interconnected polysilicon sections, and different regions are spaced apart defining a grid location at which no polysilicon section is disposed lying between directly neighboring polysilicon sections in said regions.

8. The integrated semiconductor circuit according to claim 2, including an interconnect connecting said portion of said multiplicity of said capacitive elements to said pad, said interconnect having a section through which a predetermined resistance is set, and said fuses disposed between said section and said connection to said polysilicon sections.

9. The integrated semiconductor circuit according to claim 3, including an interconnect connecting said portion of said multiplicity of said capacitive elements to said pad, said interconnect having a section through which a predetermined resistance is set, and said switching elements disposed between said section and said connection to said polysilicon sections.

10. The integrated semiconductor circuit according to claim 8, wherein said section of said interconnect is one of a plurality of sections of interconnects electrically connected in parallel and through which the same predetermined resistance is set in each case.

11. The integrated semiconductor circuit according to claim 9, wherein said section of said interconnect is one of a plurality of sections of interconnects electrically connected in parallel and through which the same predetermined resistance is set in each case.

* * * * *